(12) United States Patent
Morino

(10) Patent No.: US 9,431,318 B2
(45) Date of Patent: Aug. 30, 2016

(54) ELECTRONIC DEVICE

(71) Applicant: DENSO CORPORATION, Kariya, Aichi-pref. (JP)

(72) Inventor: Seiji Morino, Nagoya (JP)

(73) Assignee: DENSO CORPORATION, Kariya (JP)

( * ) Notice: Subject to any disclaimer, the term of this patent is extended or adjusted under 35 U.S.C. 154(b) by 129 days.

(21) Appl. No.: 14/306,536

(22) Filed: Jun. 17, 2014

(65) Prior Publication Data
US 2014/0376188 A1 Dec. 25, 2014

(30) Foreign Application Priority Data

Jun. 21, 2013 (JP) .................. 2013-130407

(51) Int. Cl.
*H05K 7/20* (2006.01)
*H01L 23/367* (2006.01)
(Continued)

(52) U.S. Cl.
CPC ........... *H01L 23/3675* (2013.01); *H01L 23/42* (2013.01); *H01L 23/49844* (2013.01); *H05K 7/209* (2013.01); *H01L 23/4006* (2013.01); *H01L 23/49562* (2013.01); *H01L 23/49861* (2013.01); *H01L 24/29* (2013.01); *H01L 24/32* (2013.01); *H01L 24/33* (2013.01); *H01L 2023/4062* (2013.01); *H01L 2224/291* (2013.01); *H01L 2224/32245* (2013.01);
(Continued)

(58) Field of Classification Search
CPC H05K 7/2039; H05K 7/20909; H01L 23/24; H01L 25/04; H02M 7/48
USPC ......................................... 361/709, 719–720
See application file for complete search history.

(56) References Cited

U.S. PATENT DOCUMENTS 6,707,671 B2 * 3/2004 Yamashita .......... H01L 23/3737
257/687
7,238,549 B2 * 7/2007 Kobayakawa ...... H01L 21/4828
257/E23.031
(Continued)

FOREIGN PATENT DOCUMENTS

JP 2002-050722 2/2002
JP 2008-130879 6/2008
JP 2011-071550 4/2011

OTHER PUBLICATIONS

Office Action (3 pages) dated May 26, 2015, issued in corresponding Japanese Application No. 2013-130407 and English translation (6 pages).

*Primary Examiner* — Tuan T Dinh
*Assistant Examiner* — Mukund G Patel
(74) *Attorney, Agent, or Firm* — Nixon & Vanderhye P.C.

(57) ABSTRACT

In an electronic device, a one-side heat radiation element and a two-side heat radiation element are disposed on a surface of a substrate adjacent to a heat sink. The one-side heat radiation element has a rear-side covered conductive portion and a rear-surface molded portion on the rear-side covered conductive portion adjacent to the heat sink, and radiates heat to the substrate. A surface of a rear-side exposed conductive portion of the two-side heat radiation element adjacent to the heat sink is exposed and the two-side heat radiation element radiates heat to the substrate and the heat sink. The rear-surface molded portion controls a limit position of the one-side heat radiation element toward the heat sink due to deformation of the substrate. A heat radiation gel is filled in between the rear-side exposed conductive portion and the heat sink to radiate heat from the two-side heat radiation element toward the heat sink.

5 Claims, 10 Drawing Sheets

(51) Int. Cl.
*H01L 23/42* (2006.01)
*H01L 23/498* (2006.01)
*H01L 23/00* (2006.01)
*H01L 23/40* (2006.01)
*H01L 23/495* (2006.01)

(52) U.S. Cl.
CPC ............ *H01L 2224/33181* (2013.01); *H01L 2924/13055* (2013.01); *H01L 2924/13091* (2013.01)

(56) References Cited

U.S. PATENT DOCUMENTS

| | | |
|---|---|---|
| 2005/0077617 A1 | 4/2005 | Hirano et al. |
| 2010/0254093 A1 | 10/2010 | Oota et al. |
| 2012/0205679 A1 | 8/2012 | Hiroki et al. |
| 2012/0314375 A1 | 12/2012 | Sato et al. |
| 2013/0003306 A1 | 1/2013 | Oota et al. |
| 2013/0050947 A1 | 2/2013 | Kadoguchi et al. |

* cited by examiner

ELECTRONIC DEVICE

CROSS REFERENCE TO RELATED APPLICATION

This application is based on Japanese Patent Application No. 2013-130407 filed on Jun. 21, 2013, the disclosure of which is incorporated herein by reference.

TECHNICAL FIELD

The present disclosure relates to an electronic device having a substrate and a semiconductor element electrically connected to the substrate.

BACKGROUND

In an electronic device in which a semiconductor element, such as a transistor, is electrically connected to a substrate, it has been known to arrange a heat sink, such as a heat radiating member, opposite to the substrate with respect to the semiconductor element, and to separate an electrical connection path from the semiconductor element to the substrate and a heat radiation path from the semiconductor element to the heat sink from each other. For example, JP2002-50722A discloses such an electronic device, and teaches to fill a heat radiation path between the semiconductor element and the heat sink with a gel heat conductive material.

As a specific example of spacing the substrate from the heat sink by a predetermined space, projections are formed on the heat sink at locations corresponding to corners of a rectangular shape of the substrate as support portions, and the substrate are fixed to the support potions by screws or the like.

In such a structure, however, an intermediate portion of the substrate between the support portions is easily bent or deformed relative to the portions of the substrate corresponding to the support portions due to a change in temperature. Therefore, it is necessary to increase the thickness of electrically insulating and heat radiating material (heat conductive material) so as to restrict the semiconductor element from being in contact with the heat sink, causing an insulation failure, even when the substrate is deformed toward the heat sink. However, if the thickness of the electrically insulating and heat radiating material is excessively increased, heat radiation performance is likely to be degraded.

In an electronic device in which a plurality of semiconductor elements is mounted on a substrate, it is not always true that the semiconductor elements generate the same amount of heat when being electrically conducted. That is, there is a case where an element that generates a relatively large amount of heat and an element that generates a relatively small amount of heat are mounted on the same substrate. A technical idea of employing different heat radiation structures for such two kinds of elements has not been known.

SUMMARY

It is an object of the present disclosure to provide an electronic device having a plurality of elements on a substrate, which is capable of reducing an influence due to deformation of the substrate and improving heat radiation performance.

According to an aspect of the present disclosure, an electronic device includes a heat sink, a substrate, a one-side heat radiation element, a two-side heat radiation element, and an electrically insulating and heat radiating material. The heat sink has a heat receiving surface. The substrate has an opposed surface, and is supported through a plurality of support portions such that the opposed surface is opposed to the heat receiving surface of the heat sink.

The one-side heat radiation element is disposed on the opposed surface of the substrate. The one-side heat radiation element is configured to radiate heat to the substrate. The one-side heat radiation element is an electronic element and includes a first chip, a first substrate-side conductive portion, and a rear-surface covered conductive portion. The first substrate-side conductive portion is disposed adjacent to the substrate than the first chip and is electrically connected to the substrate. The rear-surface covered conductive portion is disposed opposite to the substrate with respect to the first chip, and is electrically connected to the substrate through a first conductive terminal. The rear-surface covered conductive portion has a surface being covered with a molded resin, adjacent to the heat sink.

The two-side heat radiation element is disposed on the opposed surface of the substrate and is configured to radiate heat to the substrate and the heat receiving surface of the heat sink. The two-side heat radiation element is an electronic element and includes a second chip, a second substrate-side conductive portion, and a rear-surface exposed conductive portion. The second substrate-side conductive portion is disposed adjacent to the substrate than the second chip and is electrically connected to the substrate. The rear-surface exposed conductive portion is disposed opposite to the substrate with respect to the second chip and is electrically connected to the substrate through a second conductive terminal. The rear-surface exposed conductive portion has a surface without being covered with the molded resin, adjacent to the heat sink.

The electrically insulating and heat radiating material has heat conductivity, and is filled at least in between the rear-surface exposed conductive portion of the two-side heat radiation element and the heat receiving surface of the heat sink.

In the above-described structure, the molded resin covering the surface of the rear-surface covered conductive portion of the one-side heat radiation element serves as a stopper that regulates a limit position of the one-side heat radiation element toward the heat sink when the one-side heat radiation element is moved in accordance with deformation of the substrate due to a change of temperature. Further, the electrically insulating and heat radiating material is filled in between the rear-surface exposed conductive portion and the heat receiving surface of the heat sink. Therefore, heat generated from the two-side heat radiation element is favorably radiated to the heat receiving surface of the heat sink.

Since two types of elements having different characteristics are disposed on the opposed surface of the substrate, the electronic device effectively has a function of reducing influence due to the deformation of the substrate as well as a function of improving heat radiation performance.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, exemplary embodiments of the present disclosure will be described with reference to the drawings. In the exemplary embodiments, like parts are designated with like reference numbers, and descriptions thereof will not be repeated.

(First Embodiment)

Figure 3:
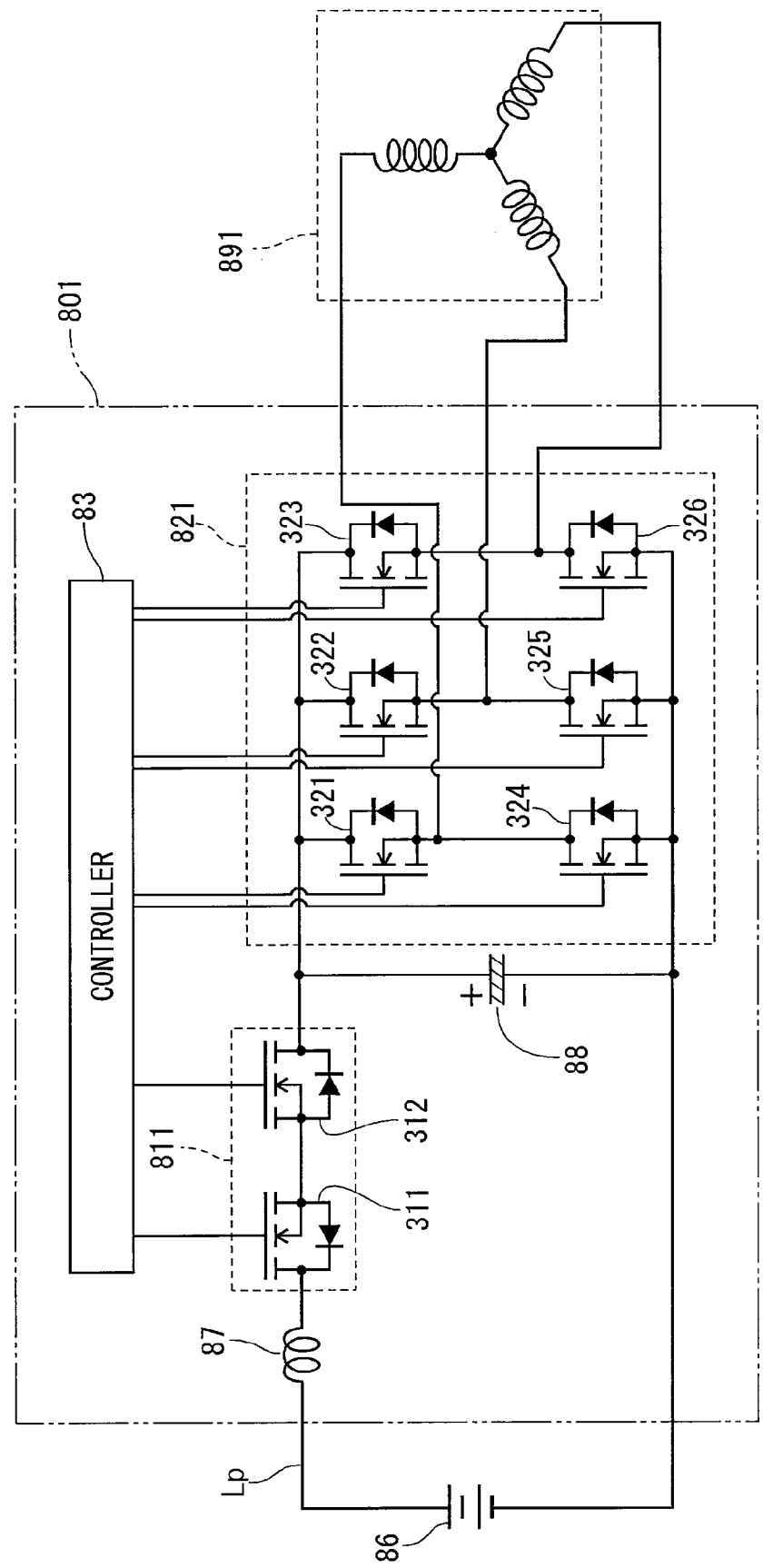
FIG. 3 is a schematic diagram of a motor driver to which the electronic device according to the first embodiment is employed.

An electronic device according to a first embodiment of the present disclosure is employed to a motor driver that drives a motor as a load. For example, an electronic device 101 is employed to a motor driver 801 that converts electric power of a battery 86 into three-phase AC power to drive a three-phase AC motor 891, as shown in FIG. 3. The motor driver 801 is, for example, employed to drive a motor that output a steering assist torque of an electric power steering apparatus of a vehicle.

The motor driver 801 generally includes a three-phase inverter circuit 821 and a power supply shut-off unit 811 disposed at an input portion of the three-phase inverter circuit 821. The three-phase inverter circuit 821 includes six inverter elements 321-326. The power supply shut-off unit 811 includes power supply relay elements 311, 312. In the present embodiment, each of the inverter elements 321-326 and the power supply relay elements 311, 312 is made of a metal oxide semiconductor field effect transistor (MOSFET) and is provided with a freewheel diode.

The six inverter elements 321-326 are bridge-connected to form upper and lower arms of a U-phase, a V-phase and a W-phase. The inverter elements 321, 322, 323 provide switching elements 321, 322, 323 of upper arms of the U-phase, the V-phase and the W-phase, respectively. The inverter elements 324, 325, 326 provide switching elements 324, 325, 326 of lower arms of the U-phase, the V-phase and the W-phase, respectively.

A connecting point between the upper arm switching element 321 and the lower arm switching element 324 is connected to a U-phase winding of the motor 891. A connecting point between the upper arm switching element 322 and the lower arm switching element 325 is connected to a V-phase winding of the motor 891. A connecting point between the upper arm switching element 323 and the lower arm switching element 326 is connected to a W-phase winding of the motor 891. In the example of FIG. 3, the motor 891 is indicated with a Y-connection. As another example, the motor 891 may have a Δ-connection.

A coil 87 and an electrolytic capacitor 88 reduce and smooth pulsation of a voltage inputted into the inverter circuit 821.

The two power supply relays 311, 312 are connected in series to each other, on a power supply line Lp between the battery 86 and the inverter circuit 821. The power supply relay element 311, which is adjacent to the battery 86 than the power supply relay element 312, is connected in such a manner that it's freewheel diode allows an electric current from the inverter circuit 821 toward the battery 86. The power supply relay element 312, which is adjacent to the inverter circuit 821 than the power supply relay element 311, is connected in such a manner that it's freewheel diode allows an electric current from the battery 86 toward the inverter circuit 821. Therefore, even if the battery 86 is connected in any direction, the power supply relay elements 311, 312 restrict an electric current from flowing between the battery 86 and the inverter circuit 821 via the freewheel diodes when the power supply relays 311, 312 are shut off.

The motor driver 801 includes a controller 83 that controls switching operations of the inverter elements 321 to 326 based on a command signal provided from another control unit (not shown) or detection signals provided from various sensors so as to supply a desired AC voltage to the motor 89. For example, the controller 83 opens and closes the power supply relay elements 311, 312 in accordance with on and off of an ignition switch of the vehicle. The controller 83 may shut off the power supply relays 311, 312 in emergency for the purpose of fail-safe, when a malfunction of the inverter circuit 821 or the like is detected.

Figure 1A:
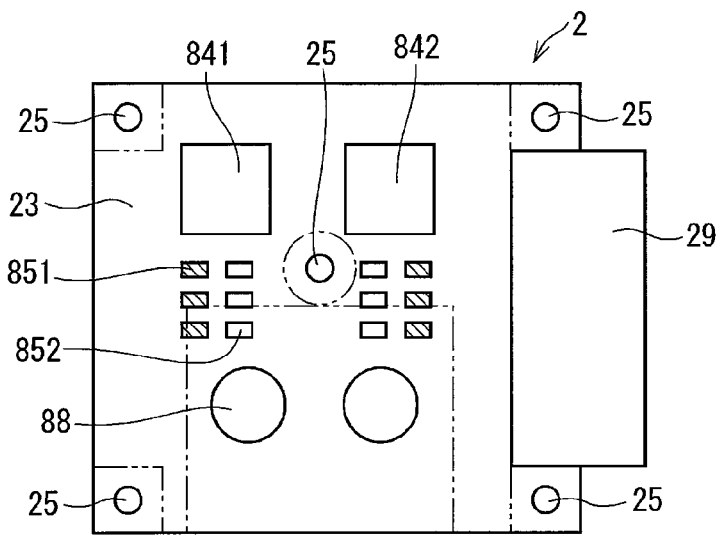
FIG. 1A is a schematic plan view of a substrate of an electronic device, when viewed along an arrow IA in FIG. 1B, according to a first embodiment of the present disclosure.
Figure 1B:
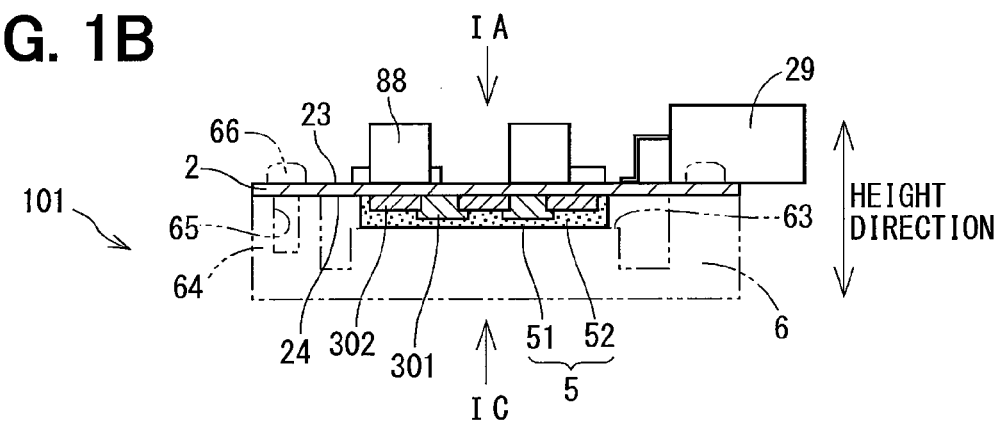
FIG. 1B is a schematic side view of the substrate of the electronic device according to the first embodiment.
Figure 1C:
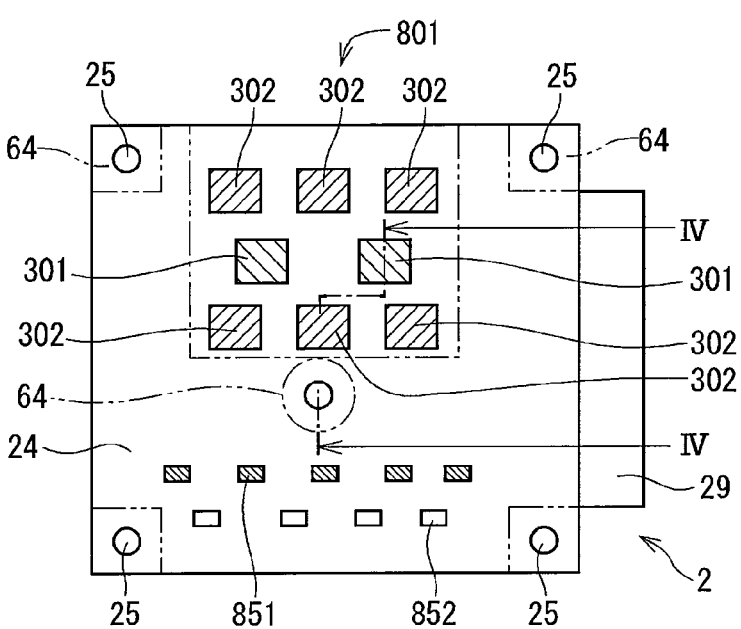
FIG. 1C is a schematic plan view of the substrate of the electronic device, when viewed along an arrow IC in FIG. 1B, according to the first embodiment.
Figure 2A:
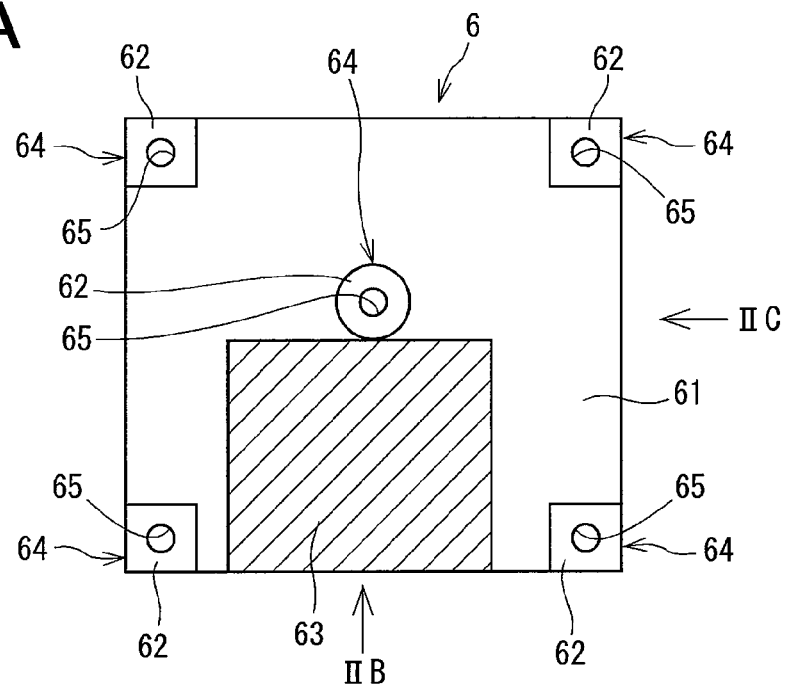
FIG. 2A is a schematic plan view of a heat sink of the electronic device shown in FIG. 1B.

The circuit of the motor driver 801 described above is realized as the electronic device 101, as shown in FIGS. 1A-1C. The electronic device 101 includes a substrate 2 and electronic parts mounted on the substrate 2. It is to be noted that, in FIGS. 1A-1C, illustration of a coil 87 is omitted. In FIGS. 1A, 1C and 2A, some components and portions are illustrated with hatching for the sake of clarity.

Figure 2B:
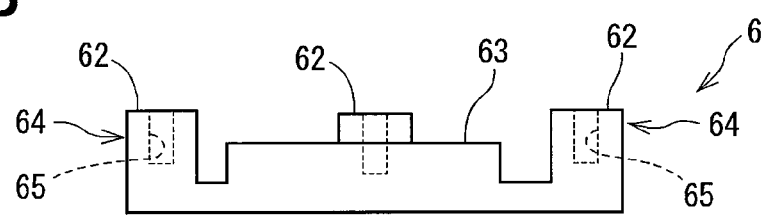
FIG. 2B is a side view of the heat sink when viewed along an arrow IIB in FIG. 2A.
Figure 2C:
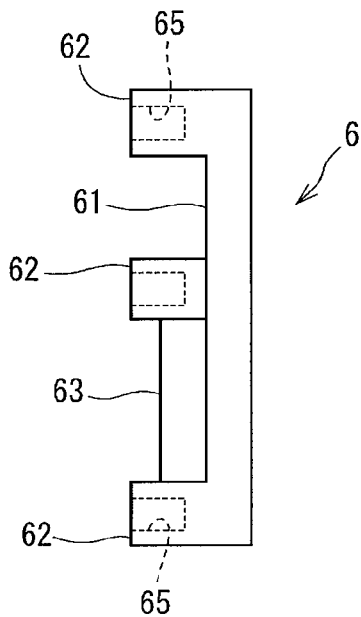
FIG. 2C is a side view of the heat sink when viewed along an arrow IIC in FIG. 2A.

The substrate 2 is fixed to support portions 64 of a heat sink 6 shown in FIGS. 2A-2C through fixing members, such as screws. The heat sink 6 is made of aluminum. The heat sink 6 receives heat generated from the electronic elements mounted on the substrate 2 when the electronic elements being electrically conducted. The heat sink 6 has a raised portion raised from a base surface 61 as a platform. The raised portion provides a heat receiving surface 63 located higher than the base surface 61. The heat sink 6 further has the plurality of support portions 64 each having a columnar shape. The support portion 64 has a support surface 62 that is higher than the heat receiving surface 63.

A surface of the substrate 2 opposite to the heat sink 6 is referred to as a first surface 23, and a surface of the substrate 2 adjacent to the heat sink 6 is referred to as a second surface 24. The second surface 24 is opposed to the heat sink 6, and thus is also referred to as an opposed surface.

In the present embodiment, the substrate 2 and the heat sink 6 each have a substantially rectangular shape. The substrate 2 is formed with through holes 25, at five locations, such as four corner portions and a middle portion of the rectangular shape. The heat sink 6 is provided with the support portions 64, at five locations, such as four corner portions and a middle portion of the rectangular shape. The support surfaces 62 of the five support portions 64 are at the same height. Each of the support portions 64 is formed with a fixing hole 65, such as a threaded hole.

To fix the substrate 2 to the heat sink 6, the substrate 2 is placed on the heat sink 6 such that the second surface 24 is in contact with the support surfaces 62, and then fixing members 66, such as screws, are fastened into the fixing holes 65 through the holes 25 of the substrate 2. Thus, the substrate 2 is supported by the support portions 64 such that the second surface 24 as the opposed surface is opposed to the heat receiving surface 63 of the heat sink 6 with a predetermined interval.

Electronic components are mounted on the first surface 23 and the second surface 24 of the substrate 2. For example, an electrolytic capacitor 88, a microcomputer 841 and a control IC 842, which constitute the controller 83, capacitors 851, and resistors 852 are mounted on the first surface 23 of the substrate 2. For example, eight MOSFETs, capacitors 851, and resistors 852 are mounted on the second surface 24 of the substrate 2. A connector 29 is provided at a side of the substrate 2. The connector 29 externally receives cables.

The six inverter elements 321-326, shown in FIG. 3, are also referred to as chips 32, and a structure including the chip 32, a lead frame and a molded resin is referred to as a semiconductor package 302. The semiconductor package 302 constitutes a two-side heat radiation element, which will be described later in detail. That is, the inverter elements 321-326 in the circuit of FIG. 3 are named based on its function, and the two-side heat radiation elements 302 in FIGS. 1A-1C and 4 and the subsequent figures are named based on its configuration in the state of being disposed on the substrate 2.

Likewise, the power supply relay elements 311, 312, shown in FIG. 3, are also referred to as chips 31, and a structure including the chip 31, a lead frame and a molded resin is referred to as a semiconductor package 301. The semiconductor package 301 constitutes a one-side heat radiation element, which will be described later in detail. The power supply relay elements 311, 312 are named based on its function, and the one-side heat radiation elements 301 are named based on its configuration in the state of being disposed on the substrate 2.

As shown in FIG. 1C, three two-side heat radiation elements 302, two one-side heat radiation elements 301, and three two-side heat radiation elements 302 are arranged on the second surface 24 of the substrate 2, in this order from the top of FIG. 1C. These elements 301, 302 are arranged in a region surrounded by the three support portions 64 two of which are located at opposite ends of the heat sink 6 and one of which is located at the middle portion of the heat sink 6. The two-side heat radiation elements 302 are located between the support portions 64 and the one-side heat radiation elements 301 with respect to a planar direction of the substrate 2.

As shown in FIG. 1B, the one-side heat radiation elements 301 and the two-side heat radiation elements 302 are located between the substrate 2 and the heat receiving surface 63 of the heat sink 6 with respect to a height direction, which is perpendicular to the planar direction of the substrate 2. In this case, the height of the one-side heat radiation elements 301 from the substrate 2 is greater than the height of the two-side heat radiation elements 302.

A heat radiation gel 5 is filled in between the heat receiving surface 63 and the one-side heat radiation elements 301 and the two-side heat radiation elements 302, as an electrically insulating and heat radiating material. The heat radiation gel 5 is made of a thermal conductive material including a silicone as a main component, for example. The heat radiation gel 5 includes a first heat radiation gel portion 51 and a second heat radiation gel portion 52. The first heat radiation gel portion 51 is located between the one-side heat radiation element 301 and the heat receiving surface 63. The second heat radiation gel portion 52 is located between the two-side heat radiation elements 302 and the heat receiving surface 63. The first heat radiation gel portion 51 has a relatively small thickness. The second heat radiation gel portion 52 has a relatively large thickness. For example, the first heat radiation gel portion 51 is thinner than the second heat radiation gel portion 52.

Figure 4:
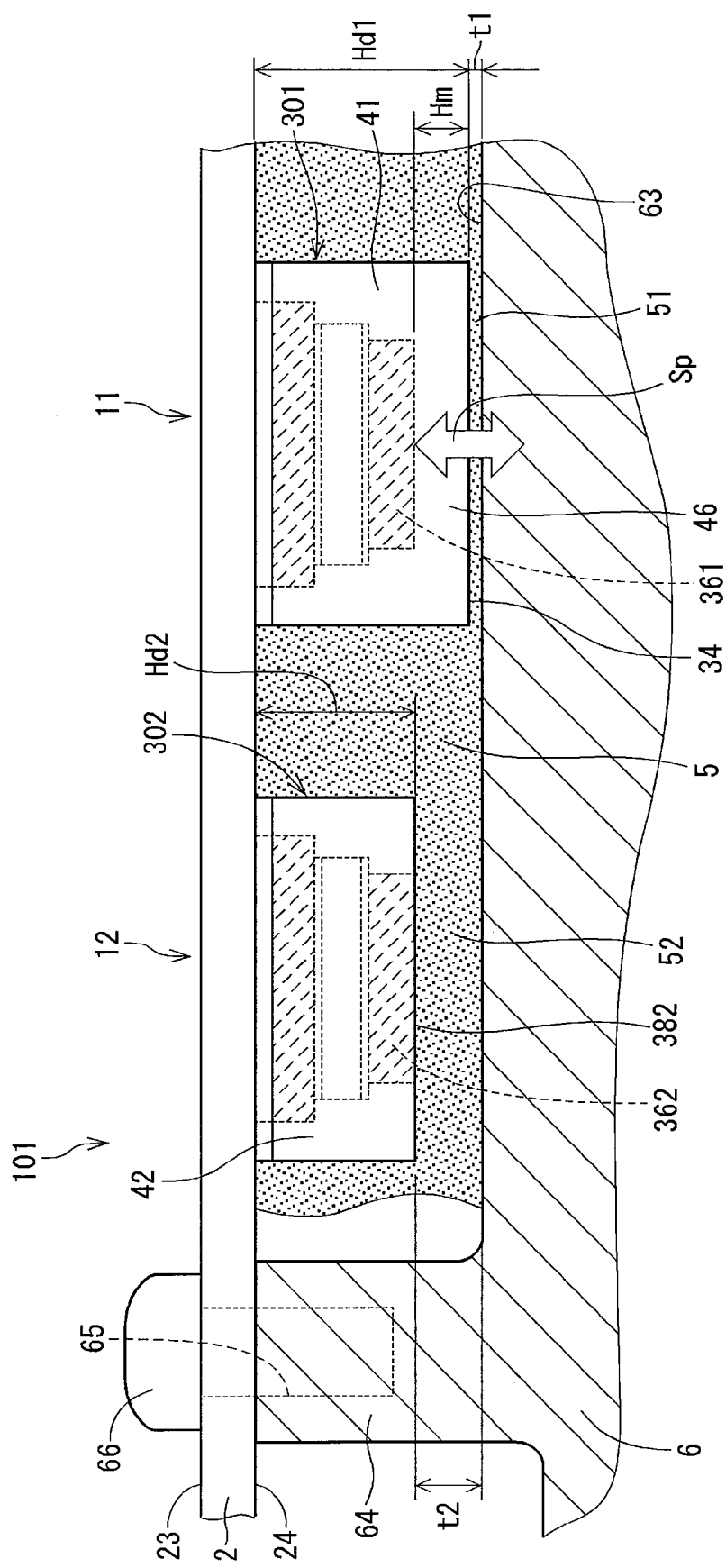
FIG. 4 is a schematic cross-sectional view of the electronic device taken along a line IV-IV in FIG. 1C.
Figure 5:
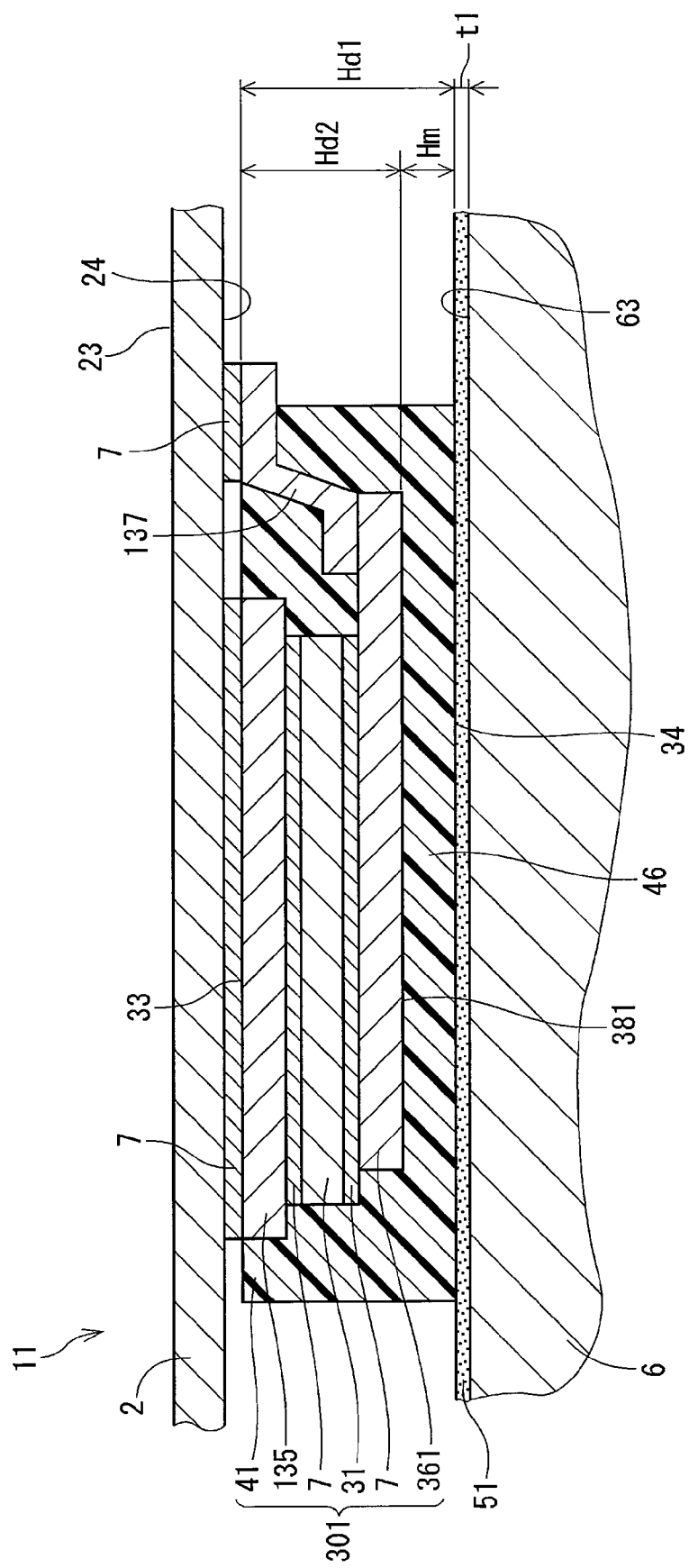
FIG. 5 is a cross-sectional view of a part of the electronic device, at which a one-side heat radiation element is arranged, in FIG. 4.
Figure 6:
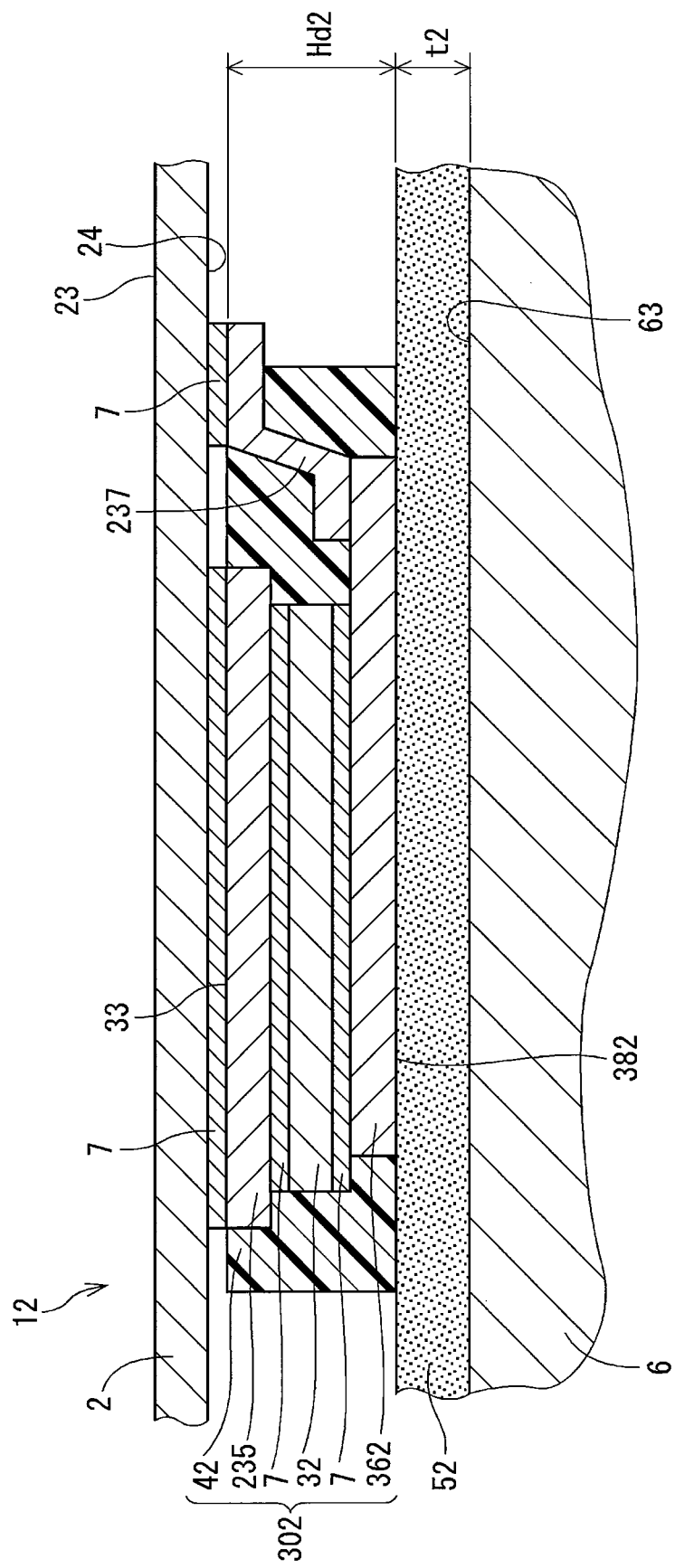
FIG. 6 is a cross-sectional view of a part of the electronic device, at which a two-sided heat radiation element is arranged, in FIG. 4.

Next, a description will be made with reference to FIGS. 4 to 6. FIG. 4 is a cross-sectional view taken along a line IV-IV in FIG. 1C. FIGS. 5 and 6 are cross-sectional views each illustrating a further detailed structure of an element arrangement portion. A reference numeral 11 denotes an element arrangement portion including the one-side heat radiation element 301 is mounted. A reference numeral 12 denotes an element arrangement portion including the two-side heat radiation element 302.

As shown in FIGS. 4 and 5, the one-side heat radiation element 301 includes the chip 31, a lead frame 135, a lead frame 361, a lead terminal 137 and a molded resin 41. The lead frame 135 serves as a first substrate-side conductive portion. The lead frame 135 is disposed the chip 31 adjacent to the substrate 2. The lead frame 135 is electrically connected to the chip 31 through a solder layer 7. The lead frame 135 is also electrically connected to the substrate 2 through a solder layer 7, which is disposed on an end surface 33 adjacent to the substrate 2. In the MOSFET, a drain electrode exposed from the molded resin 41 usually constitutes the lead frame 135.

The lead frame 361 serves as a rear-surface covered conductive portion. The lead frame 361 is disposed opposite to the substrate 2 with respect to the chip 31. The lead frame 361 is electrically connected to the chip 31 through a solder layer 7. Also, the lead frame 361 is electrically connected to the substrate 2 through the lead terminal 137 and a solder layer 7. In this case, lead terminal 137 serves a first conductive terminal.

The molded resin 41 covers the sides of the chip 31, the lead frame 135, the lead frame 361 and the lead terminal 137. The molded resin 41 further covers the rear surface 381 of the lead frame 361, the rear surface 381 being adjacent to the heat sink 6 for electrical insulation. Hereinafter, a part of the molded resin 41 covering the rear surface 381 of the lead frame 361 is referred to as a rear-surface molded portion 46.

The first heat radiation gel portion 51 is filled between the heat receiving surface 63 of the heat sink 6 and the end surface 34 of the one-side heat radiation element 301 adjacent to the heat sink 6, that is, the end surface 34 of the rear-surface molded portion 46. The first heat radiation gel portion 51 is thin, and serves as the electrically insulating and heat radiating material.

The end surface 34 of the one-side heat radiation element 301 and the heat receiving surface 63 of the heat sink 6 have fine asperities including projections and recesses. Because the first heat radiation gel portion 51 is filled in the recesses, an air layer between the end surface 34 and the heat receiving surface 63 is reduced as small as possible. As such, the heat radiation property improves.

Heat generated from the chip 31 of the one-side heat radiation element 301 when the chip 31 being electrically conducted is released to the substrate 2 via the lead frame 135 as well as via the lead frame 361 and the lead terminal 137. However, since the rear surface 381 of the lead frame 361 is covered with the rear-surface molded portion 46, the rear surface 381 is thermally insulated. Therefore, the heat generated from the chip 31 is less likely to be conducted to the heat receiving surface 63 of the heat sink 6. In the one-side heat radiation element 301, the heat generated from the chip 31 is typically conducted to the substrate 2, as discussed above.

As shown in FIGS. 4 and 6, the two-side heat radiation element 302 includes a chip 32, a lead frame 235, a lead frame 362, a lead terminal 237 and a molded resin 42. The lead frame 235 and the lead terminal 237 of the two-side heat radiation element 302 have the similar structure to the lead frame 135 and the lead terminal 137 of the one-side heat radiation element 301. In this case, the lead frame 235 serves as a second substrate-side conductive portion, and the lead terminal 237 serves as a second conductive terminal.

The lead frame 362 serves as a rear-surface exposed conductive portion. The lead frame 362 has a relationship with the chip 32 and the lead terminal 237 similar to the relationship of the one-side heat radiation element 301 with the lead frame 361. The difference between the lead frame 362 of the two-side heat radiation element 302 and the lead frame 361 of the one-side heat radiation element 301 is that a rear surface 382 of the lead frame 362 adjacent to the heat sink 6 is not covered with the molded resin 42 and is exposed.

In this case, the rear surface 382 being exposed means a state of the rear surface 382 before the second heat radiation gel portion 52 is filled. In the two-side heat radiation element 302, the molded resin 42 covers only the sides of the chip 32, the lead frame 235, the lead frame 362 and the lead terminal 237.

The second heat radiation gel portion 52 is filled between the exposed rear surface 382 of the lead frame 362 and the heat receiving surface 63 of the heat sink 6. The second heat radiation gel portion 52 is relatively thick. In other words, the second heat radiation gel portion 52 is thicker than the first heat radiation gel portion 51.

A part of heat generated from the chip 32 of the two-side heat radiation element 302 when the chip 32 being electrically conducted is released to the substrate 2 via the lead frame 235 as well as via the lead frame 362 and the lead terminal 237. A remaining part of the heat generated from the chip 32 is conducted to the heat receiving surface 63 via the second heat radiation gel portion 52 from the exposed rear surface 382 of the lead frame 362. In the two-side heat radiation element 302, the heat of the chip 32 is radiated from two sides, that is, released to the substrate 2 and the heat receiving surface 63.

Next, the height of the one-side heat radiation element 301 and the height of the two-side heat radiation element 302 will be described in detail. In this case, the height is measured in a direction perpendicular to the planar direction of the substrate 2. The height may be also referred to a dimension in the direction perpendicular to the planar direction of the substrate 2.

In the two-side heat radiation element 302, the height (dimension) from the rear surface 382 of the lead frame 362 to the end surface 33 of the lead frame 235 is referred to as Hd2. In the one-side heat radiation element 301, the height (dimension) from the rear surface 381 of the lead frame 361 to the end surface 33 of the lead frame 135 is the same as the height Hd2.

In the one-side heat radiation element 301, the sum of the height Hd2 and a height (thickness) Hm of the rear-surface molded portion 46 is equal to a height Hd1 of the one-side heat radiation element 301. As such, the height Hd1 of the one-side heat radiation element 301 is greater than the height of the two-side heat radiation element 302. These heights are expressed by the following equations (1), (2).

$$Hd1 = Hd2 + Hm \tag{1}$$

$$Hd1 > Hd2 \tag{2}$$

Therefore, it can be said that the height Hd1 of the one-side heat radiation element 301 is determined based on the height Hm of the rear-surface molded portion 46. The height Hm of the rear-surface molded portion 46 is determined so that the thickness t2 of the second heat radiation gel portion 52 filled between the two-side heat radiation element 302 and the heat receiving surface 63 is equal to or greater than a minimum thickness that is necessary to ensure electric insulation. The height Hm is slightly smaller than the thickness t2. For example, the height Hm is approximately 0.2 to 0.3 mm. The thickness t2 of the second heat radiation gel portion 52 will be further described later.

In the electronic device 101 of the present embodiment, the power supply relay elements 311, 312 and the inverter elements 321-326 are mounted on the second surface 24 of the substrate 2. In other words, the power supply relay elements 311, 312 and the inverter elements 321-326 are mounted on the same surface of one substrate. The power supply relay elements 311, 312 have a one-side heat radiation structure, and the inverter elements 321-326 have a two-side heat radiation structure. Namely, each of the power supply relay elements 311, 312 is configured as the one-side heat radiation element 301, and each of the inverter elements 321-326 is configured as the two-side heat radiation element 302. The reason why such a structure is employed will be described based on the amount of heat generated from the element.

Figure 7:
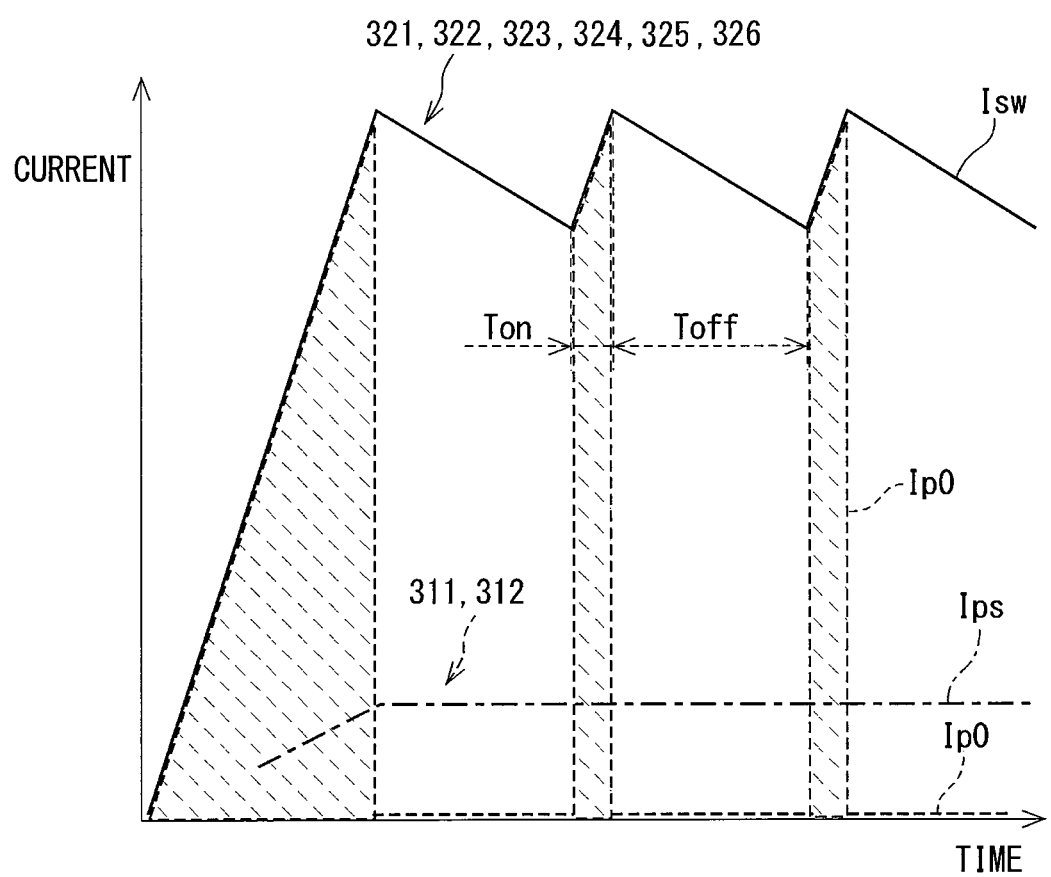
FIG. 7 is a graph illustrating electric currents flowing in an inverter element and a power source relay element when the electronic device according to the first embodiment is in operation.

FIG. 7 is a graph schematically illustrating a change of electric current with time. In particular, the graph of FIG. 7 illustrates an electric current flowing in the power supply relay elements 311, 312 and an electric current flowing in the inverter elements 321-326, when the motor driver 801 is in normal operation. The inverter elements 321-326 are switch-operated at an interval of several to several tens microseconds (μs), for example.

In an on period Ton, the drain and the source are electrically conducted and the electric current flows between the drain and the source. In an off period Toff, although an increase in the electric current is interrupted, the electric current with the value equal to or greater than a predetermined value is maintained by the electric current flowing in the freewheel diode. Since the electric current Isw, which is high in average, flows, the integrated current is relatively large.

On the other hand, in a case where the capacity of the electrolytic capacitor 88 is relatively small, a power supply current Ip0 flowing in the power supply relay elements 311, 312 changes as a waveform indicated with a dashed line hatching. Note that, since the electric current is smoothed by the coil 87 and the electrolytic capacitor 88, the electric current changes as a waveform Ips indicated with a single-chain dashed line. The integrated current of the power supply current Ips smoothed is relatively small.

The difference between the integrated currents affects on the difference of the amount of heat generated from the elements. In the present embodiment, therefore, the inverter elements 321-326, which generate a relatively large amount of heat, employs the structure of the two-side heat radiation element 302, so that the heat generated by the switching operation is released to the substrate 2 and the heat sink 6.

On the other hand, the power supply relay elements 311, 312 generate a relatively small amount of heat. Therefore, it is enough to release the heat only to the substrate 2. Therefore, the power supply relay elements 311, 312 do not need to employ the structure of the two-side heat radiation element 302. Instead, in the present embodiment, focusing on the point of reducing the influence due to the bent or deformation of the substrate 2, the power supply relay elements 311, 312 positively employ the structure of the one-side heat radiation element 301.

The influence due to the bent or deformation of the substrate 2 will be described with reference to a comparative example shown in FIG. 8.

Figure 8:
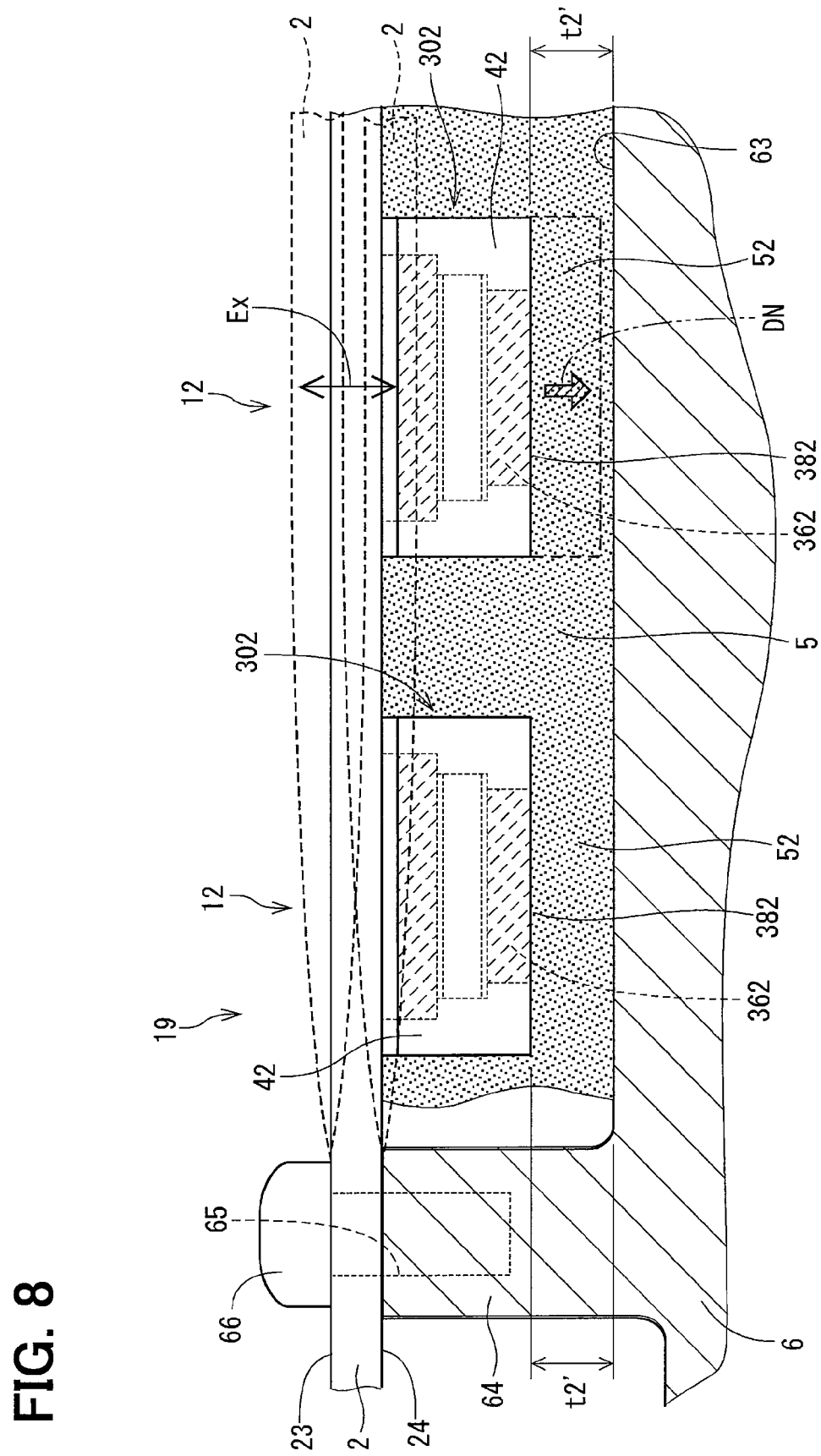
FIG. 8 is a schematic cross-sectional view of an electronic device as a comparative example to the first embodiment.

Referring to FIG. 8, an electronic device 19 of the comparative example has the substrate 2 and the heat sink 6, similar to the electronic device 101 of the first embodiment. However, the electronic device 19 employs the two-side heat radiation elements 302, without employing the one-side heat radiation element 301.

In the electronic device 19, when the substrate 2 is bent or deformed, as shown by dashed lines and an arrow Ex, due to a change in temperature, the second heat radiation gel portion 52 disposed between the heat receiving surface 63 and the rear surface 382 does not serve as a support. Therefore, a limit position of the two-side heat radiation element 302 toward the heat sink 6 cannot be controlled.

If the two-side heat radiation element 302 is moved toward the heat sink 6, as shown by an arrow DN, and the rear surface 382 of the lead frame (rear-surface exposed conductive portion) 362 contacts the heat receiving surface 63, there is a fear that an insulation failure will occur. To avoid such a situation, it is necessary to sufficiently increase the thickness t2' of the second heat radiation gel portion 52. However, if the thickness t2' is excessively increased, the heat radiation performance from the two-side heat radiation element 302 to the heat sink 6 is likely to deteriorate, and thus it is not favorable.

On the other hand, the electronic device 101 of the first embodiment has the one-side heat radiation element 301. The one-side heat radiation element 301 has the rear-surface molded portion 46 adjacent to the heat sink 6. When the substrate 2 is bent or deformed due to the change in temperature, as shown by an arrow Sp in FIG. 4, the end surface 34 of the rear-surface molded portion 46 contacts the heat receiving surface 63, and thus serves as the support. Therefore, the rear-surface molded portion 46 serves as a stopper that controls the limit position of the one-side heat radiation element 301.

As shown in FIG. 4, it is enough to set the thickness t2 of the second heat radiation gel portion 52 at least equal to or greater than the minimum thickness that is necessary to ensure the electric insulation, and it is not necessary to excessively increase the thickness t2 of the second heat radiation gel portion 52. Namely, in the electronic device 101, the thickness t2 of the second heat radiation gel portion 52 is determined to ensure the electric insulation between the two-side heat radiation element 302 and the heat sink 6. In the one-side heat radiation element 301, it is determined so that the sum of the height Hm of the rear-surface molded portion 46 and the thickness t1 of the first heat radiation gel portion 51 is equal to the thickness t2 of the second heat radiation gel portion 52.

The thickness t1 of the first heat radiation gel portion 51 is determined to a thickness so that the asperities of the end surface 34 of the rear-surface molded portion 46 and the heat receiving surface 63 of the heat sink 6 are filled with the first heat radiation gel portion 51 and an air layer, which causes thermal insulation due to the air, does not exist between the end surface 34 and the heat receiving surface 63. For example, when the height Hm of the rear-surface molded portion 46 is 0.2 to 0.3 mm, the thickness t1 of the first heat radiation gel portion 51 is approximately 0.1 mm, which is smaller than the height Hm.

Advantageous effects of the electronic device 101 of the present embodiment will be summarized as follows (1) In the electronic device 101, the one-side heat radiation element 301 and the two-side heat radiation element 302 are mounted on the same second surface 24 of the same substrate 2. The surface 381 of the lead frame (rear-surface covered conductive portion) 361 is covered with the molded resin 41, and the one-side heat radiation element 301 radiates heat to the substrate 2. The surface 382 of the lead frame (rear-surface exposed conductive portion) 362 adjacent to the heat sink 6 is exposed from the molded resin 41, and the two-side heat radiation element 302 radiates heat to the substrate 2 and the heat sink 6. The first heat radiation gel portion 51 and the second heat radiation gel portion 52 are filled between the elements 301, 302 and the heat receiving surface 63 of the heat sink 6.

The rear-surface molded portion 46 of the one-side heat radiation element 301 serves as the stopper that restricts the limit position of the one-side heat radiation element 301 when the one-side heat radiation element 301 is moved in accordance with the deformation of the substrate 2 due to the change in temperature. In regard to the two-side heat radiation element 302, the second heat radiation gel portion 52 is filled between the lead frame 362 and the heat receiving surface 63 of the heat sink 6, and the heat radiation property toward the heat receiving surface 63 is favorably ensured.

Since two types of elements having different characteristics commonly exist, the electronic device 101 has effectively achieves the function of reducing the influence due to the deformation of the substrate 2 and the function of radiating heat in the two-side heat radiation element 302.

(2) The height Hd1 of the one-side heat radiation element 301 is greater than the height Hd2 of the two-side heat radiation element 302 by the height Hm of the rear-surface molded portion 46. The thickness t2 of the second heat radiation gel portion 52 adjacent to the two-side heat radiation element 302 is equal to or greater than the minimum thickness that is necessary to ensure the electric insulation. As such, the insulation failure between the lead frame 362 and the heat receiving surface 63 is reduced.

(3) The thickness t1 of the first heat radiation gel portion 51 adjacent to the one-side heat radiation element 301 is smaller than the height Hm of the rear-surface molded portion 46. As such, the reliability of the stopper of the rear-surface molded portion 46 relative to the deformation of the substrate 2 further improves.

(4) As shown in FIG. 1C, the two-side heat radiation elements 302 are arranged between the support portions 64 of the heat sink 6 and the one-side heat radiation elements 301 with favorable balance. Therefore, since the one-side heat radiation elements 301 serves as the support, the deformation at a position corresponding to the two-side heat radiation elements 302 is reduced.

For example, the one-side heat radiation elements 301 are provided by the two power supply relay elements 311, 312. Therefore, the area that achieves the function of the support can be further expanded. Since the thickness t2 of the second heat radiation gel portion 52 can be reduced as small as possible, the heat radiation performance is improved.

(5) The electronic device 101 is exemplarily employed to the motor driver 801. In this case, the power supply relay elements 311, 312, which have the relatively small integrated current, are configured as the one-side heat radiation elements 301, and the inverter elements 321-326, which has the relatively large integrated current, are configured as the two-side heat radiation elements 302. As such, the effects of the electronic device 101 described above are favorably achieved in the motor driver 801.

(Second Embodiment)

An electronic device according to a second embodiment will be described with reference to FIGS. 9 and 10.

Figure 9:
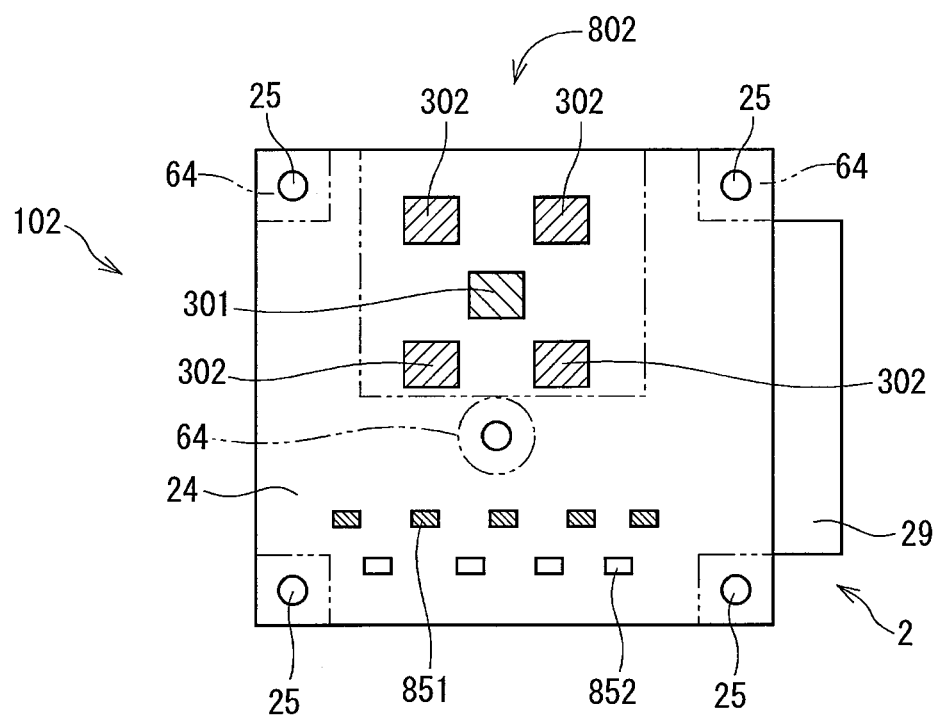
FIG. 9 is a schematic plan view of a substrate of an electronic device according to a second embodiment of the present disclosure.
Figure 10:
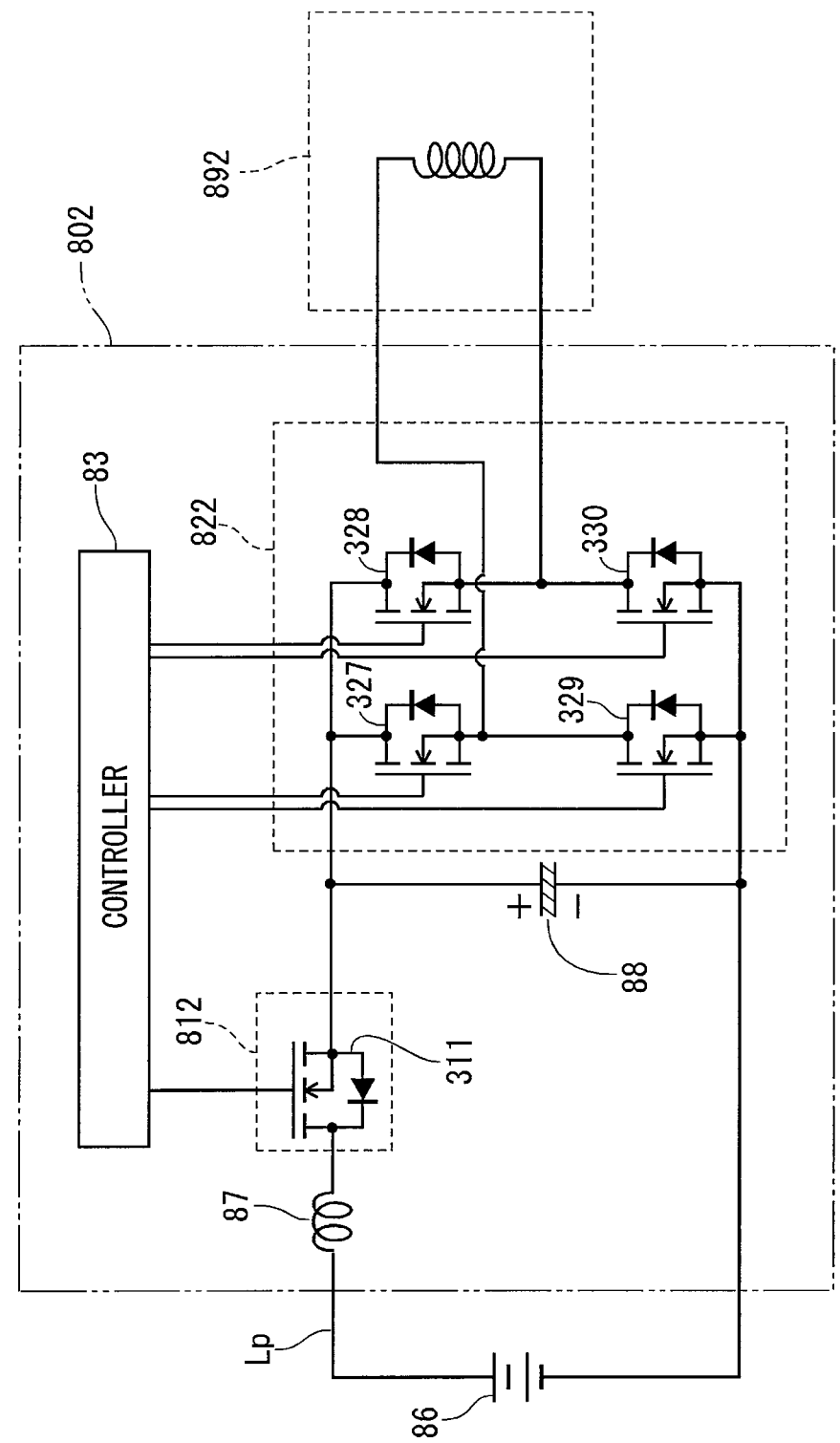
FIG. 10 is a schematic diagram of a motor driver to which the electronic device according to the second embodiment is employed.

FIG. 9 is a plan view of a substrate 2 of an electronic device of the second embodiment. FIG. 10 is a schematic block diagram of the electronic device 102.

In the first embodiment, the electronic device 101 is employed to the motor driver 801 of the three-phase AC motor 891. In the second embodiment, an electronic device 102 is employed to a motor driver 802 of a brush DC motor 892. Similar to the motor driver 801, the motor driver 802 is used to drive a motor that outputs a steering assisting torque of an electric power steering device of a vehicle, for example.

The motor driver 802 has an H-bridge circuit 822 constructed of four H-bridge elements 327, 328, 329, 330. A power supply shut-off circuit 812 has one power supply relay element 311, and does not have a power supply relay element for restricting inverse connection. The H-bridge elements 327-330 are provided by the two-side heat radiation elements 302, similar to the inverter elements of the first embodiment. The single power supply relay element 311 is provided by the one-side heat radiation element 301.

Two two-side heat radiation elements 302, one one-side heat radiation element 301, and two two-side heat radiation elements 302 are arranged on the second surface 24 of the substrate 2, in this order from the top of FIG. 9. Similar to the first embodiment, the two-side heat radiation elements 302 are arranged between the support portions 64 and the one-side heat radiation element 301 with respect to a planar direction of the substrate 2.

Also in this structure, the advantageous effects similar to the first embodiment are achieved.

(Other Embodiments)

(A) In the embodiments described above, the first heat radiation gel portion 51 is filled between the end surface 34 of the rear-surface molded portion 46 of the one-side heat radiation element 301 and the heat receiving surface 63 of the heat sink 6. The thickness t1 of the first heat radiation gel portion 51 is smaller than the height Hm of the rear-surface molded portion 46. As described above, the first heat radiation gel portion 51 has the function of filling the asperities on the end surface 34 of the rear-surface molded portion 46 and the heat receiving surface 63 and reducing the air layer therebetween. In a case where the smoothness of the end surface 34 and the heat receiving surface 63 is high, and it is not necessary to concern about the air layer, the thickness of the first heat radiation gel portion 51 may be zero.

(B) The electrically insulating and heat radiating material includes a thermal conductive grease or the like, other than the heat radiation gel 5. As the thermal conductive grease, a grease disclosed in JP-A-2011-71550 may be used.

(C) The support portions, which support the substrate so that the substrate is opposed to the heat receiving surface of the heat sink with a predetermined distance, is not limited to the one that is integrally formed with the heat sink as a boss. The support portions may be provided by a spacer or the like, which is a separate part.

(D) Examples of the electronic elements, which are suitable to have the structure of the two-side heat radiation element, are switching elements used for a DCDC converter. The switching elements may be an electric field effect transistor or an IGBT, other than the MOSFET.

(E) In the first embodiment, the electronic device is exemplarily employed to the motor driver that has a single system inverter circuit. Alternatively, the electronic device may be employed to any device, such as a device having an inverter circuit with two or more systems. The electronic device may be employed to any driver, such as a driver that drives a load other than the motor.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. An electronic device comprising:
a heat sink having a heat receiving surface;
a substrate having an opposed surface and being supported through a plurality of support portions such that the opposed surface is opposed to the heat receiving surface of the heat sink;
a one-side heat radiation element being disposed on the opposed surface of the substrate and being configured to radiate heat to the substrate, the one-side heat radiation element being an electronic element and including:
  a first chip;
  a first substrate-side conductive portion being disposed adjacent to the substrate than the first chip and being electrically connected to the substrate; and
  a rear-surface covered conductive portion being disposed further from the substrate than the first chip, being electrically connected to the substrate through a first conductive terminal, and having a surface being covered with a molded resin adjacent to the heat sink;
a two-side heat radiation element being disposed on the opposed surface of the substrate and being configured to radiate heat to the substrate and the heat receiving surface of the heat sink, the two-side heat radiation element being an electronic element and including:

a second chip;

a second substrate-side conductive portion being disposed adjacent to the substrate than the second chip and being electrically connected to the substrate;

a rear-surface exposed conductive portion being disposed further from the substrate than the second chip, being electrically connected to the substrate through a second conductive terminal, and having a surface without being covered with the molded resin adjacent to the heat sink; and an electrically insulating and heat radiating material having heat conductivity and being filled at least in between the rear-surface exposed conductive portion of the two-side heat radiation element and the heat receiving surface of the heat sink, wherein the one-side heat radiation element has a height greater than a height of the two-side heat radiation element with respect to a direction perpendicular to a planar direction of the substrate, the electrically insulating and heat radiating material filled in between the rear-surface exposed conductive portion of the two-side heat radiation element and the heat receiving surface of the heat sink has a thickness that is equal to or greater than a minimum thickness necessary to endure electric insulation, and the two-side heat radiation element is located between at least one of the plurality of support portion and the one-side heat radiation element with respect to a planar direction of the substrate.

2. The electronic device according to claim 1, wherein a portion of the molded resin covering the surface of the rear-surface covered conductive portion is referred to as a rear-surface molded portion, and the one-side heat radiation element has a height that is determined based on a height of the rear-surface molded portion with respect to a direction perpendicular to a planar direction of the substrate.

3. The electronic device according to claim 2, wherein the electrically insulating and heat radiating material is further filled in between the rear-surface molded portion of the one-side heat radiation element and the heat receiving surface of the heat sink, and the electrically insulating and heat radiating material filled in between the rear-surface molded portion of the one-side heat radiation element and the heat receiving surface of the heat sink has a thickness that is smaller than the height of the rear-surface molded portion.

4. The electronic device according to claim 1, wherein an integrated current flowing in the two-side heat radiation element when the electronic device is in operation is greater than that of the one-side heat radiation element.

5. An electronic device comprising:

a heat sink having a heat receiving surface;

a substrate having an opposed surface and being supported through a plurality of support portions such that the opposed surface is opposed to the heat receiving surface of the heat sink;

a one-side heat radiation element being disposed on the opposed surface of the substrate and being configured to radiate heat to the substrate, the one-side heat radiation element being an electronic element and including:

a first chip;

a first substrate-side conductive portion being disposed adjacent to the substrate than the first chip and being electrically connected to the substrate; and a rear-surface covered conductive portion being disposed further from the substrate than the first chip, being electronically connected to the substrate through a first conductive terminal, and having a surface being covered with a molded resin adjacent to the heat sink;

a two-side heat radiation element being disposed on the opposed surface of the substrate and being configured to radiate heat to the substrate and the heat receiving surface of the heat sink, the two-side heat radiation element being an electronic element and including:

a second chip;

a second substrate-side conductive portion being disposed adjacent to the substrate than the second chip and being electrically connected to the substrate;

a rear-surface exposed conductive portion being disposed further from the substrate than the second chip, being electrically connected to the substrate through a second conductive terminal, and having a surface without being covered with the molded resin adjacent to the heat sink;

an electrically insulating and heat radiating material having heat conductivity and being filled at least in between the rear-surface exposed conductive portion of the two-side heat radiation element and the heat receiving surface of the heat sink; and a driving device that drives a load, the driving device including one of an inverter circuit having an inverter element and an H-bridge circuit having an H-bridge element, wherein the two-side heat radiation element is one of the inverter element and the H-bridge element, and the one-side heat radiation element is a power supply relay element that is disposed at an input portion of the one of the inverter circuit and the H-bridge circuit to shut off an electric power supply from a direct current power supply.

* * * * *